United States Patent
Aram

(10) Patent No.: US 7,023,271 B1
(45) Date of Patent: Apr. 4, 2006

(54) VARIABLE-GAIN CONSTANT-BANDWIDTH TRANSIMPEDANCE AMPLIFIER

(75) Inventor: Farbod Aram, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 24 days.

(21) Appl. No.: 10/814,534

(22) Filed: Mar. 31, 2004

(51) Int. Cl.
*H03F 1/24* (2006.01)

(52) U.S. Cl. .......................... 330/99; 330/69
(58) Field of Classification Search ................ 330/99, 330/69, 252, 308
See application file for complete search history.

(56) References Cited

U.S. PATENT DOCUMENTS

| | | | |
|---|---|---|---|
| 3,737,798 A * | 6/1973 | Faraguet et al. ............... | 330/85 |
| 3,760,287 A * | 9/1973 | Harris ............................ | 330/9 |
| 3,918,005 A * | 11/1975 | Bruckenstein et al. ........ | 330/99 |
| 4,535,233 A | 8/1985 | Abraham | |
| 4,564,818 A | 1/1986 | Jones | |
| 4,724,315 A | 2/1988 | Goerne | |
| 4,764,732 A | 8/1988 | Dion | |
| 4,772,859 A | 9/1988 | Sakai | |
| 4,914,402 A | 4/1990 | Dermitzakis et al. | |
| 5,010,588 A | 4/1991 | Gimlett | |
| 5,345,073 A | 9/1994 | Chang et al. | |
| 5,382,920 A | 1/1995 | Jung | |
| 5,532,471 A | 7/1996 | Khorramabadi et al. | |
| 5,646,573 A | 7/1997 | Bayruns et al. | |
| 6,037,841 A | 3/2000 | Tanji et al. | |
| 6,057,738 A | 5/2000 | Ku et al. | |
| 6,084,478 A | 7/2000 | Mayampurath | |
| 6,114,913 A | 9/2000 | Entrikin | |
| 6,122,131 A | 9/2000 | Jeppson | |
| 2002/0153949 A1 | 10/2002 | Yoon | |

FOREIGN PATENT DOCUMENTS

JP   406061752 A   3/1994
JP   H6-61752      3/1994

OTHER PUBLICATIONS

Charles A. Holt, "Electronic Circuits Digital and Analog", by John Wiley & Sons, Inc., 1978, pp. 423, 431, and 436.
U.S. Appl. No. 10/072,843, filed Feb 2, 2002, Entitled, "Nested Transimpedance Amplifier", pp. 1-17, and 7 sheets of drawings.
U.S. Appl. No. 10/459,731, filed Jul. 11, 2003, entitled, "Nested Transimpedance Amplifier With Capacitive Cancellation of Input Parasitic Capacitance", pp. 1-46 and 19 sheets of drawings.
You et al., SA 21.2 "A Multistate Amplifier Topology with Nested Gm-C Compensation for Low-Voltage Application", IEEE International Solid-State Circuits Conference, Digest of Technical Papers, ISSCC97, Feb 8, 1997, pp. 348-349.

* cited by examiner

*Primary Examiner*—Henry Choe

(57) ABSTRACT

A transimpedance amplifier (TIA) circuit according to the present invention includes a first opamp having an input and an output. A second opamp has an input that communicates with the first opamp and an output. A first feedback path communicates with the input and the output of the first opamp and includes a first resistance. A second feedback path communicates with the input and the output of the second opamp and includes a second resistance. A third feedback path communicates with the input of the first opamp and the output of the second opamp.

43 Claims, 8 Drawing Sheets

VARIABLE-GAIN CONSTANT-BANDWIDTH TRANSIMPEDANCE AMPLIFIER

CROSS-REFERENCE TO RELATED APPLICATIONS

This application is related to U.S. patent application Ser. Nos. 10/072,843 filed on Feb. 2, 2002 and 10/459,731 filed on Jul. 11, 2003, which are hereby incorporated herein by reference.

FIELD OF THE INVENTION

The present invention relates to transimpedance amplifiers, and more particularly to a transimpedance amplifier having a relatively constant bandwidth at different gain levels.

BACKGROUND OF THE INVENTION

Operational amplifiers (opamps) are used in many different types of circuits including preamplifiers, variable gain amplifiers and the like. Referring now to FIG. 1A, an amplifier 20 includes an opamp 24 and a feedback path 28 that couples an output of the opamp 24 to an inverting input thereof. The non-inverting input is coupled to ground or another reference potential. The amplifier 20 in FIG. 1A has a gain value of one. For this reason, the amplifier 20 is usually called a unity-gain amplifier or buffer.

Referring now to FIG. 2A, an amplifier 30 is shown that is similar to the unity-gain amplifier 20 in FIG. 1A. However, in the amplifier 30, a resistance R is provided in the feedback path 28. Another resistance R is connected between an input of the amplifier 30 and the inverting input of the opamp 24. The amplifier 30 has a gain value of two.

The most relevant characteristics of an amplifier circuit are usually gain and bandwidth. In order to derive the bandwidth, an open loop response technique is used. The technique of looking at the open loop response provides information relating to the bandwidth and maximum achievable bandwidth of an amplifier circuit.

The DC gain of the open loop response is determined by opening the feedback loop and attaching a voltage source to an input side of the opened feedback loop. The output voltage is sensed at an output side of the opened feedback loop. Open loop response versions of the circuits in FIGS. 1A and 2A are shown in FIGS. 1B and 2B. To derive the bandwidth, the DC gain of the open loop response and the first dominant pole $P_1$ are found. Assuming stable operation, there is only one dominant pole $P_1$ located below the crossover frequency. The crossover frequency is the product of the DC gain of the open loop response and the first dominant pole $P_1$. The crossover frequency usually defines the bandwidth of the closed-loop amplifier. The maximum available bandwidth is related to the second non-dominant pole $P_2$.

Referring now to FIGS. 3A and 3B, the open loop response for the amplifiers in FIGS. 1B and 2B is shown, respectively. There is a constant gain from DC to a frequency of the first dominant pole $P_1$. At the frequency of the pole $P_1$, the gain begins falling. There is an inverse relationship between gain and bandwidth of the amplifiers 20 and 30. In FIG. 3A, the amplifier 20 has a gain of one. Therefore, the gain is constant until the zero crossing. In FIG. 3B, the gain is two until the intersection with the open loop response. In general, higher gain values are associated with lower bandwidth and lower gain values are associated with higher bandwidth. The bandwidth of the amplifier 30 is approximately half of the bandwidth of the unity-gain amplifier 20 while the gain of the amplifier 30 is twice the gain of the amplifier 20.

Referring now to FIG. 4, it may be desirable to adjust the frequency of poles $P_1$ and $P_2$ for some applications. For example, it may be desirable for the amplifier to provide a relatively constant bandwidth at different gain values. In FIG. 4, the gain values are relatively constant from DC up to the frequency of the first dominant pole $P_1$. Because the first dominant pole $P_1$ is close to the second non-dominant $P_2$, the gain values fall off sharply upon reaching the first dominant pole $P_1$.

Various compensation techniques are known for adjusting the frequency of the poles of the amplifier. The opamp may be implemented using a two-stage amplifier. In two-stage amplifiers, Miller compensation and Ahuja compensation are sometimes used. Miller compensation employs a feedback capacitor connected across an input and output of the second stage amplifier. In Ahuja compensation, a current gain device is added in the feedback loop of the second stage amplifier. Another compensation technique is used in folded cascode circuits that are output compensated. Specifically, a capacitor is coupled to an output of the circuit.

Referring now to FIGS. 3A, 3B and 5, it is difficult to adjust the frequencies of the poles $P_1$ and $P_2$ shown in FIGS. 3A and 3B without creating stability problems. In FIG. 5, the phase response that is associated with the open loop responses of FIGS. 3A and 3B is shown. The phase response is 180 degrees from DC to about the frequency of the first pole $P_1$. At the frequency of pole $P_1$, the phase response is approximately 90 degrees. The phase response remains at 90 degrees from the frequency of the first dominant pole $P_1$ until about the frequency of the second non-dominant pole $P_2$. At the frequency of the second non-dominant pole $P_2$, the phase response is approximately zero degrees.

The phase response in FIG. 5 also illustrates a phase margin of approximately 90 degrees. The phase margin is usually defined at unity gain. For acceptable stability, the phase margin should be greater than approximately 55–60 degrees otherwise oscillation will occur. Therefore, the 90 degree phase margin that is shown in FIG. 5 is typically acceptable. However, moving the frequency of the second non-dominant pole $P_2$ closer to the zero crossing will reduce the phase margin. At some point, this will cause oscillation. Conversely, moving the first dominant pole $P_1$ closer to the zero crossing in FIGS. 3A and 3B will increase the phase margin. At some point, this too will cause oscillation. For these reasons, it is generally not possible to adjust the frequencies of the poles $P_1$ and $P_2$ shown in FIGS. 3A and 3B to produce the open loop response of FIG. 4 without creating stability problems.

Referring now to FIGS. 6A and 6B, a transimpedance amplifier (TIA) 60 includes an opamp 64 having a transconductance value $(-g_m)$. The opamp 64 has a feedback resistor $(R_f)$ 66. A capacitance $(C_1)$ 70 is connected between an input of the TIA 60 and ground or a reference potential. Another capacitance $(C_2)$ 72 and a load resistance $(R_L)$ 74 are connected between the output of the TIA 60 and ground or a reference potential. An input 76 to the TIA 60 is a current I and an output 80 of the TIA 60 is a voltage V.

Referring now to FIG. 7, the open loop response for the TIA 60 in FIG. 6B is shown. At DC, the gain is equal to $g_m R_L$. If we assume that the capacitance $C_1$ is much greater than the capacitance $C_2$ and the resistance $R_f$ is large, the frequency of the first dominant pole $P_1=1/(C_1 R_f)$. Further, the frequency of the second non-dominant pole $P_2=1/(C_2 *(R_L$ in parallel with $R_f))$. The zero crossing occurs at a frequency of $(g_m R_L)/(C_1 R_f)$.

Referring now to FIG. 8, the closed loop response for the TIA 60 is shown. Two different gain curves are illustrated in FIG. 8. One curve corresponds to the resistance $R_f = R_{f1}$ and the other curve corresponds to the resistance $R_f = R_{f2}$, where $R_{f2} > R_{f1}$. For a given value of $R_f$, higher gain is associated with lower bandwidth and lower gain is associated with higher bandwidth.

SUMMARY OF THE INVENTION

A transimpedance amplifier (TIA) circuit according to the present invention includes a first opamp having an input and an output. A second opamp has an input that communicates with the first opamp and an output. A first feedback path communicates with the input and the output of the first opamp and includes a first resistance. A second feedback path communicates with the input and the output of the second opamp and includes a second resistance. A third feedback path communicates with the input of the first opamp and the output of the second opamp.

In other features, the first feedback path includes a first capacitance in parallel with the first resistance. The second feedback path includes a second capacitance in parallel with the second resistance. The first feedback path further includes a third resistance in series with the first resistance and the first capacitance. The third resistance has a resistance value that is approximately two times a resistance value of the first resistance. The first and third resistances have substantially equal resistance values. The second feedback path further includes a fourth resistance in series with the second resistance and the second capacitance. The fourth resistance has a resistance value that is approximately two times a resistance value of the second resistance. The second and fourth resistances have substantially equal resistance values. The first and second capacitances have substantially equal capacitance values.

In other features, a third opamp has an input that communicates with the output of the first opamp and an output that communicates with the input of the second opamp. The third feedback path includes a fifth resistance. Third, fourth and fifth capacitances have one end that communicates with the inputs of the first, second and third opamps, respectively. A sixth capacitance communicates with the output of the second opamp.

In other features, a preamplifier comprises the TIA circuit. A hard disk drive comprises the preamplifier. A variable gain amplifier comprises the TIA circuit. A read channel circuit comprises the variable gain amplifier.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 2A:
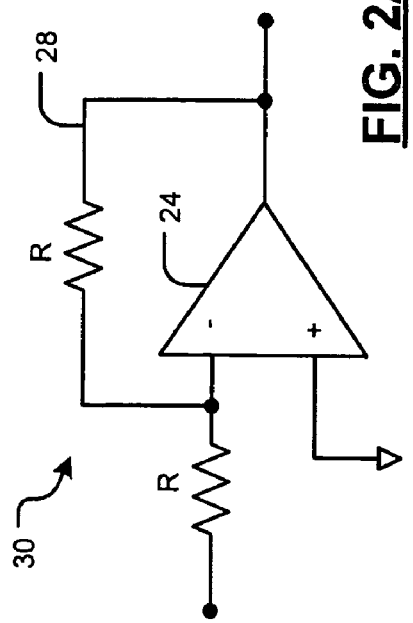
FIGS. 1A and 2A are electrical schematics of amplifier circuits according to the prior art.
Figure 2B:
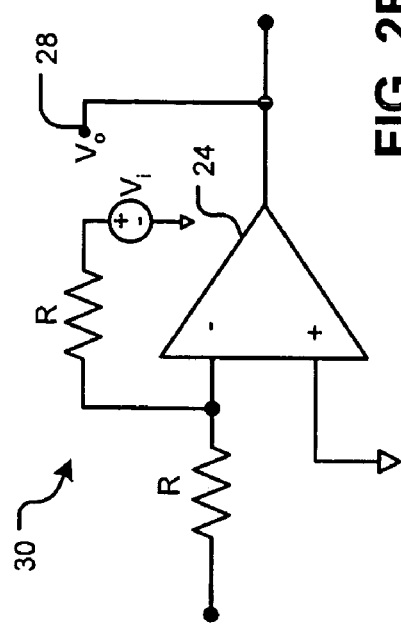
FIGS. 1B and 2B are electrical schematics of the circuits of FIGS. 1A and 2A in an open loop response configuration.
Figure 1A:
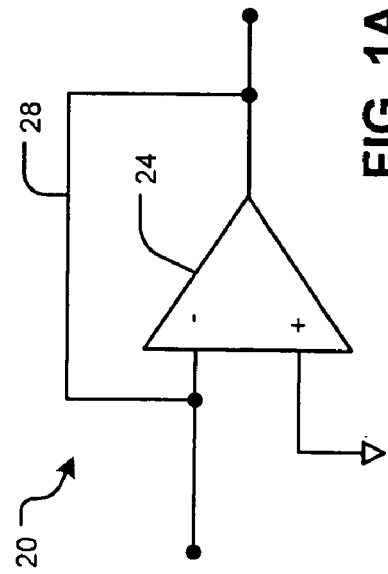
Figure 1B:
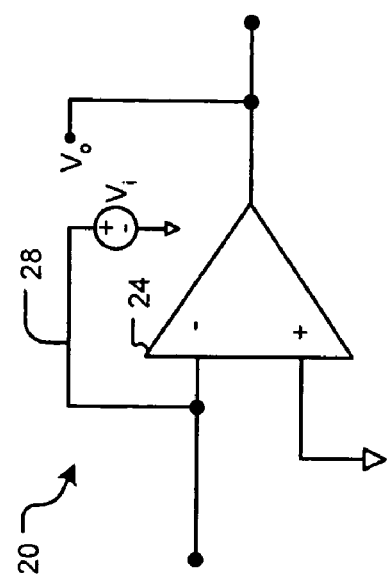
Figure 3A:
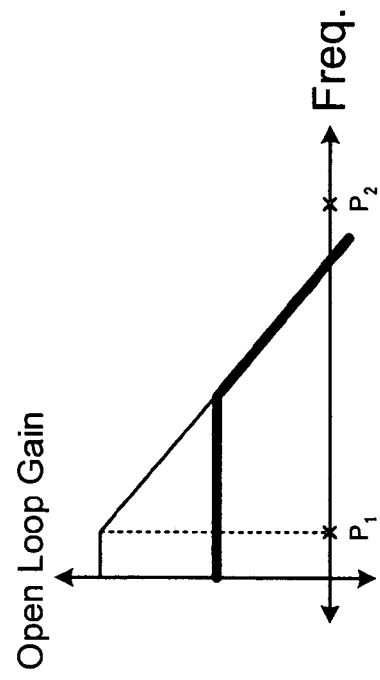
FIGS. 3A and 3B are graphs illustrating the open loop responses of the amplifiers of FIGS. 1B and 2B.
Figure 3B:
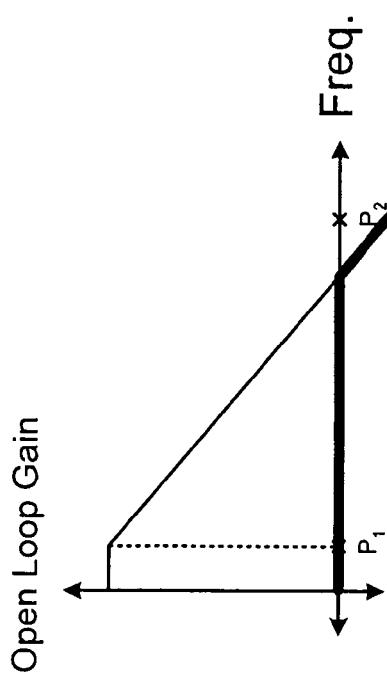
Figure 5:
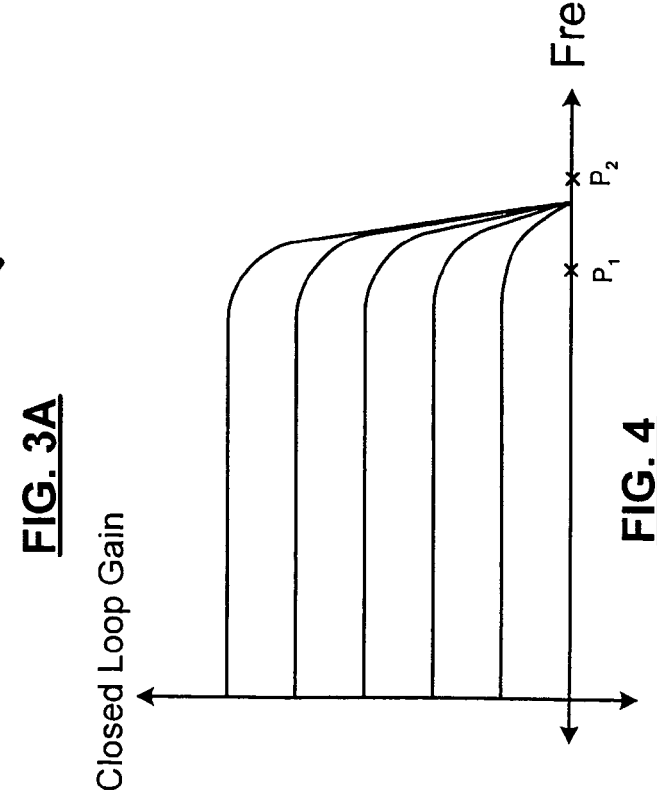
FIG. 5 is a graph illustrating the phase response corresponding to the open loop response of FIGS. 3A and 3B.
Figure 4:
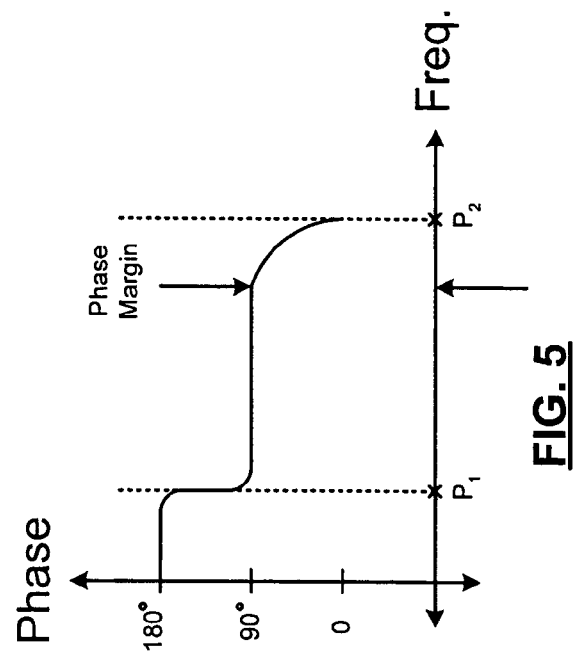
FIG. 4 is a graph illustrating a desired closed loop gain response for the amplifiers of FIGS. 1A and 2A.
Figure 6A:
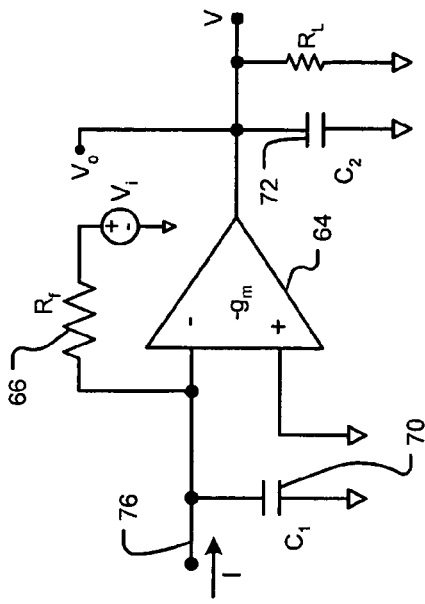
FIGS. 6A and 6B are electrical schematics of TIA circuits according to the prior art in closed loop and open-loop response configurations.
Figure 6B:
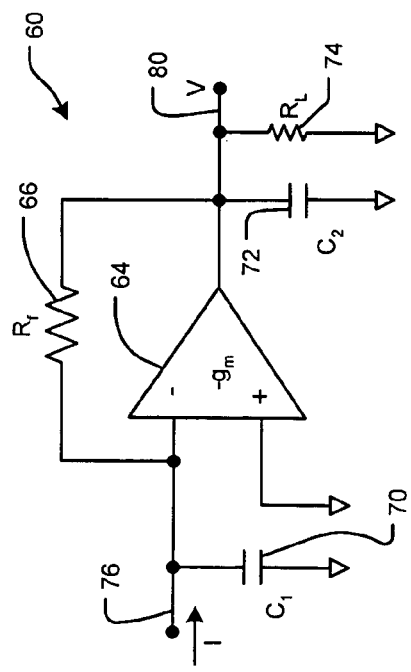
Figure 7:
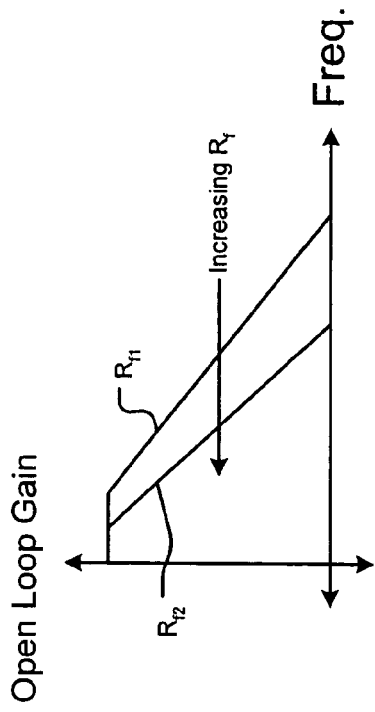
FIG. 7 is a graph illustrating the open loop gain response for the TIA of FIG. 6B.
Figure 8:
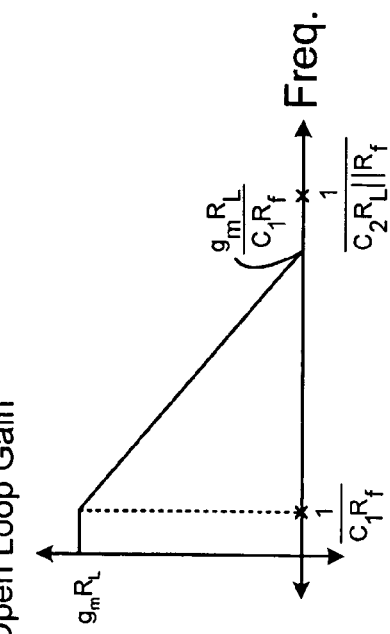
FIG. 8 is a graph illustrating the open loop gain response of the TIA of FIG. 6 for two different values of a resistance $R_f$.

The following description of the preferred embodiment(s) is merely exemplary in nature and is in no way intended to limit the invention, its application, or uses. For purposes of clarity, the same reference numbers will be used in the drawings to identify similar elements.

Figure 9:
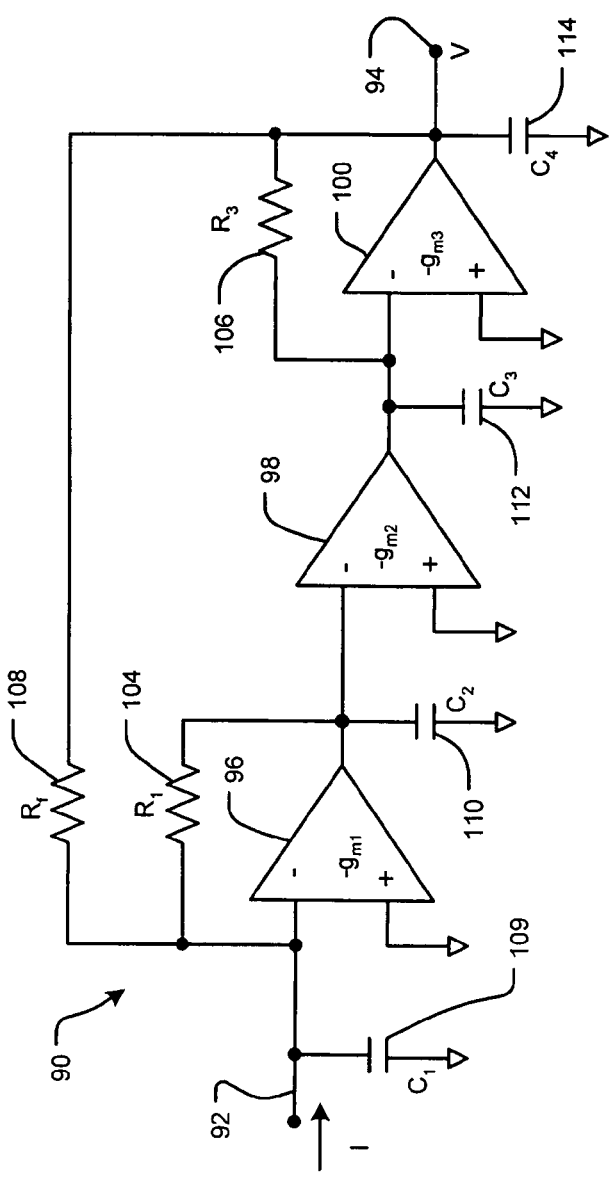
FIG. 9 is an electrical schematic of a multi-stage TIA according to the present invention.

Referring now to FIG. 9, a multi-stage TIA 90 converts an input current I at 92 into an output voltage V at 94. The TIA 90 includes a first opamp 96, a second opamp 98 and a third opamp 100 that are coupled in series between the input and the output of the TIA 90. The opamps 96, 98 and 100 have transconductance values $-g_{m1}$, $-g_{m2}$ and $-g_{m3}$, respectively. A resistance ($R_1$) 104 is connected between the input and the output of the first opamp 96. Another resistance ($R_3$) 106 is connected between the input and the output of the third opamp 100. A resistance ($R_f$) 108 is connected between the input and the output of the TIA 90. Capacitors and/or capacitances $C_1$, $C_2$, and $C_3$ (109, 110, and 112, respectively) are coupled between the inputs of opamps 96, 98, and 100, respectively, and ground (or another reference potential). Additionally, a capacitor and/or capacitance ($C_4$) 960 is coupled between the output of the TIA 90 and ground (or another reference potential).

Figure 10:
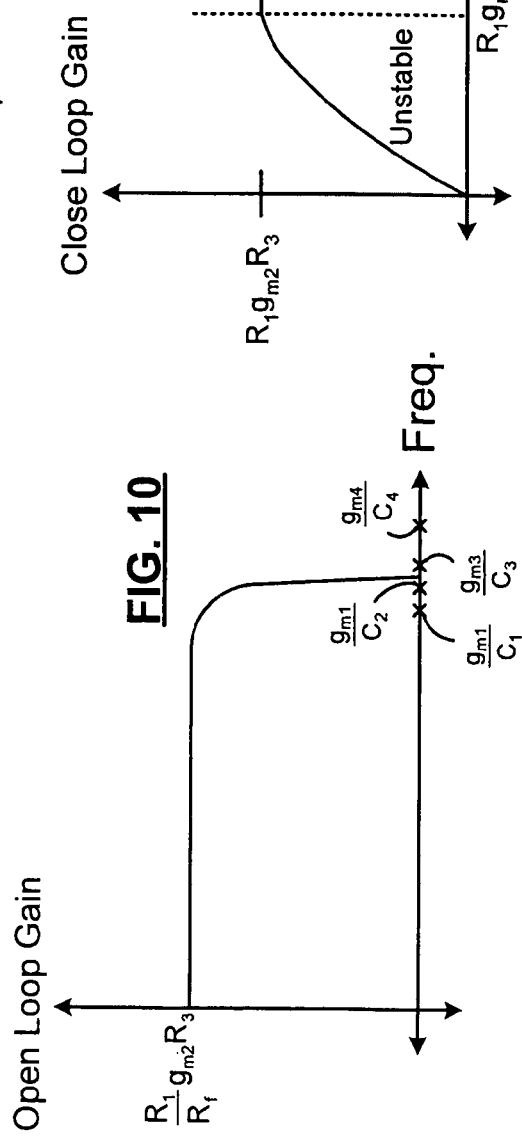
FIG. 10 is a graph illustrating the open loop response for the TIA of FIG. 9.

Referring now to FIG. 10, the open loop response of the TIA 90 is shown. The resistance $R_f \gg 1/g_{m1}$ and the gain produced by the first opamp 96 is $R_1/R_f$. Additionally, $g_{m1}/C_1 \approx g_{m1}/C_2 \approx g_{m3}/C_3 \approx g_{m3}/C_4$ such that the poles produced by the capacitors $C_1$–$C_4$ are closely spaced. There is no dominant pole. The DC gain is equal to $(R_1/R_f)g_{m2}R_3$. This gain value remains relatively constant until the closely spaced pole frequencies. At those frequencies, the gain falls off sharply, as shown in FIG. 10. FIG. 10 illustrates a nearly constant bandwidth for a range of gain values. However, given the above assumptions regarding the gain parameters and capacitor values, the TIA 90 may experience phase margin problems when operating above unity gain.

Figure 11:
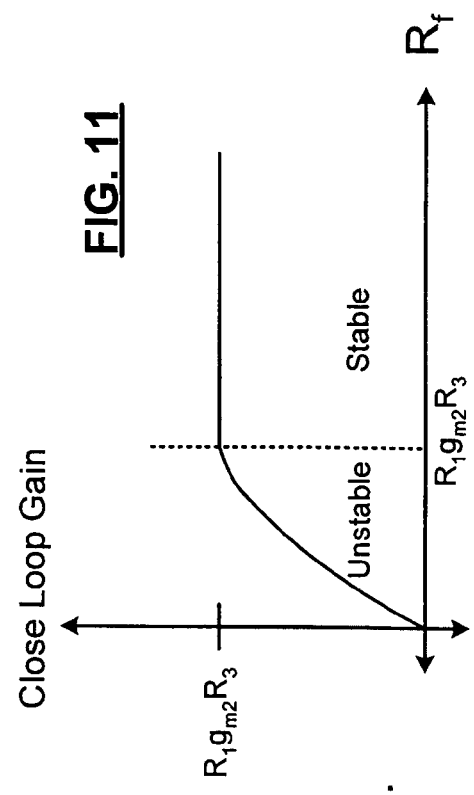
FIG. 11 is a graph illustrating the gain of the TIA of FIG. 9 as a function of a resistance $R_f$.

Referring now to FIG. 11, it is possible to operate the TIA 90 below unity gain using high values of the resistance $R_f$. However, limited gain variation can be realized. This is illustrated in FIG. 11, where the gain is shown as a function of the resistance $R_f$. When the value of resistance $R_f$ is infinite, the gain is equal to $R_1 g_{m2} R_3$. When $R_f = R_1 g_{m2} R_3$, the gain is unity. When it is above this value, the gain cannot be varied much and the circuit is stable. When $R_f < R_1 g_{m2} R_3$, the gain can be varied but the circuit is unstable.

Figure 12A:
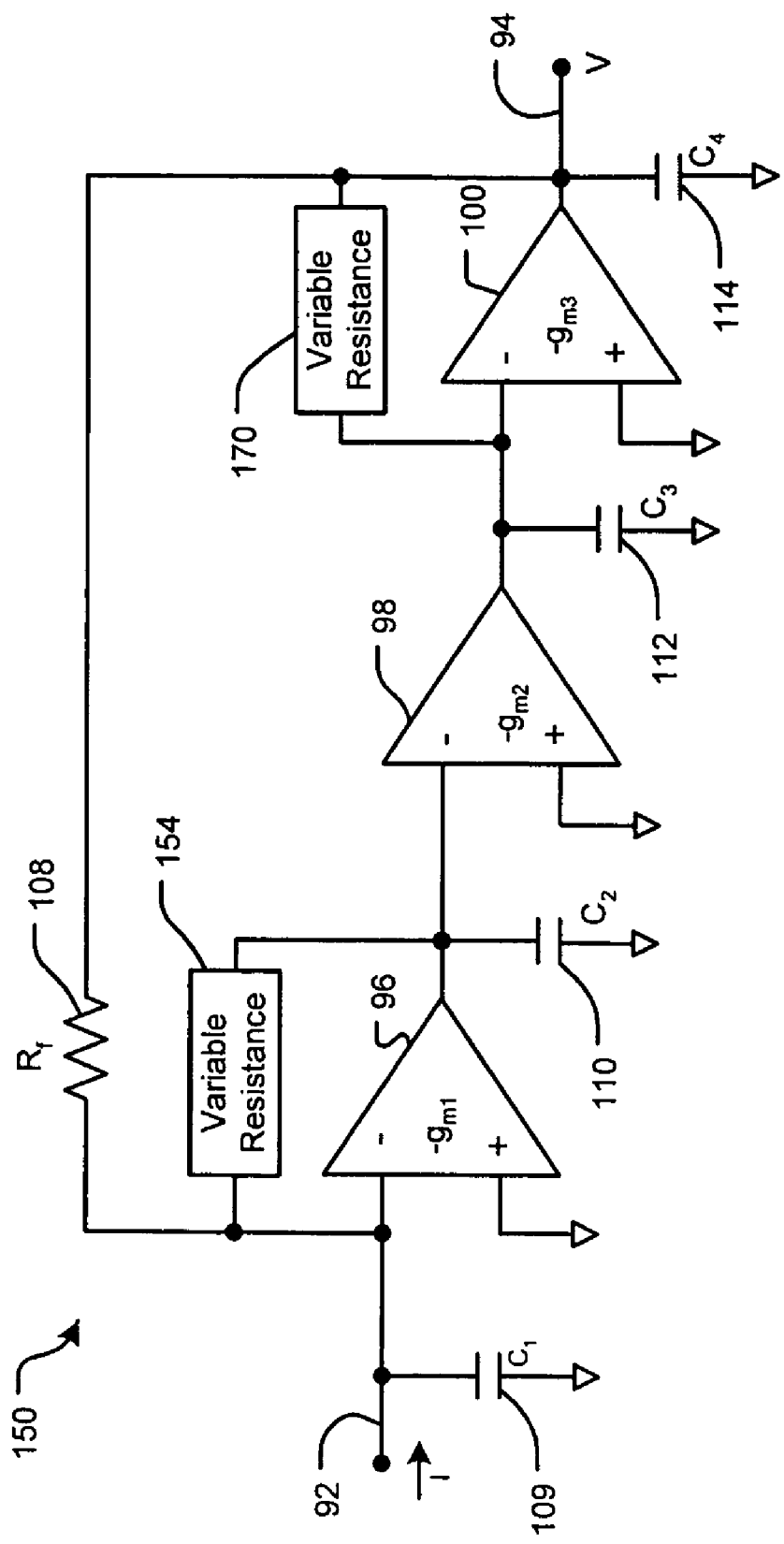
FIGS. 12A and 12B are electrical schematics of a variable-gain constant-bandwidth TIA according to the present invention.
Figure 12B:
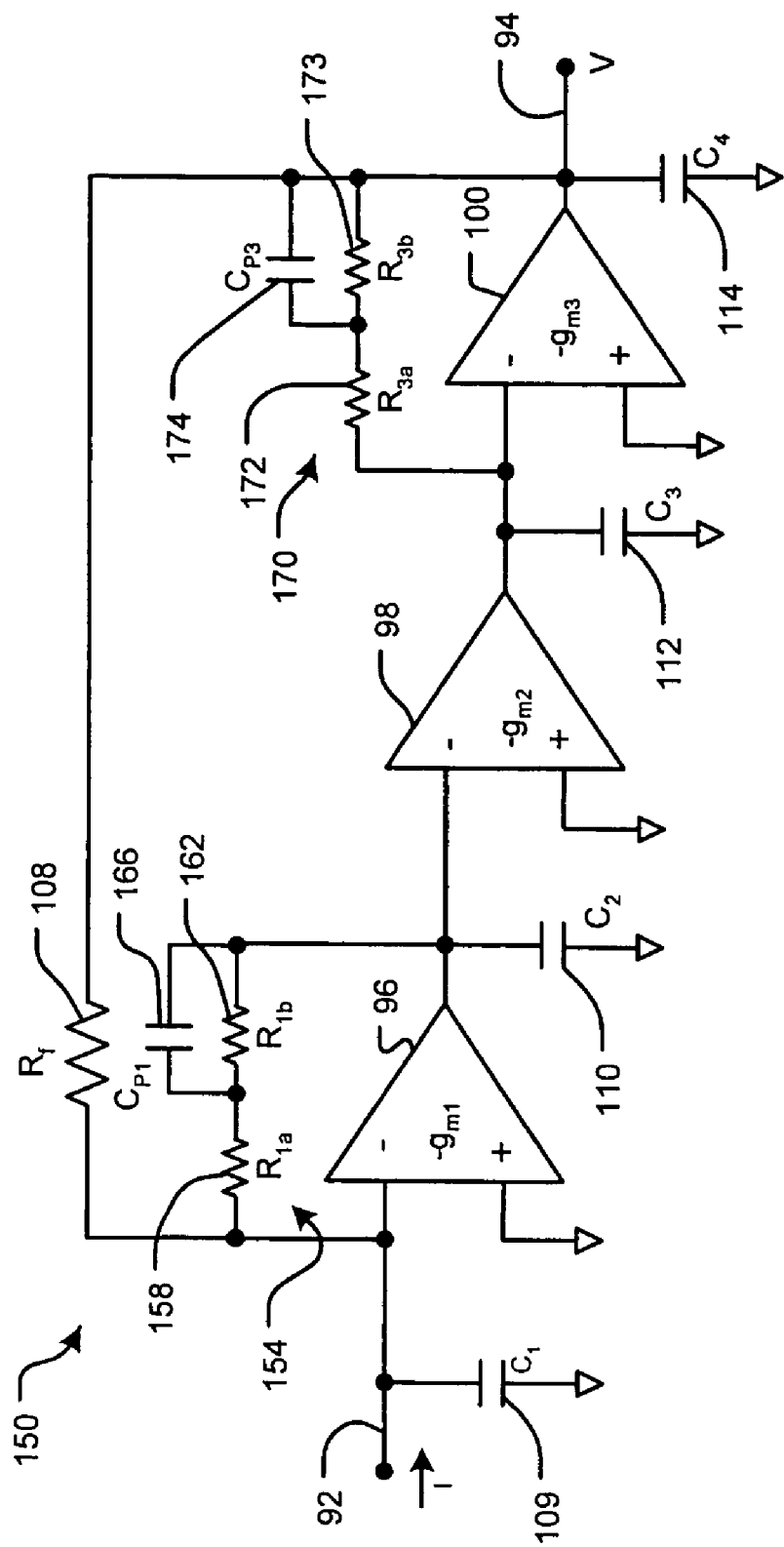

Referring now to FIGS. 12A, 12B, 15A and 15B, a TIA 150 according to one embodiment of the present invention is shown. The TIA 150 includes a feedback path 154 that communicates with the input and the output of the opamp 96. In FIG. 12A, the feedback path 154 has a resistance that decreases as frequency increases. For example and referring now to FIG. 12B, the feedback path 154 can include a resistor $R_{1a}$ 158 connected in series with the parallel combination of a resistor $R_{1b}$ 162 and a capacitor and/or capacitance ($C_{P1}$) 166. At low frequencies, the capacitor 166 is essentially an open circuit and the resistance of the feedback path 154 is essentially $R_1 = R_{1a} + R_{1b}$. At high frequencies, the capacitor 166 shunts the resistor 162 and the resistance of the feedback path 154 is essentially $R_{1a}$. The combination of resistances $R_{1a}$ and $R_{1b}$ and the capacitance $C_{P1}$ provide a variable resistance that decreases with increases in frequency.

Figure 15A:
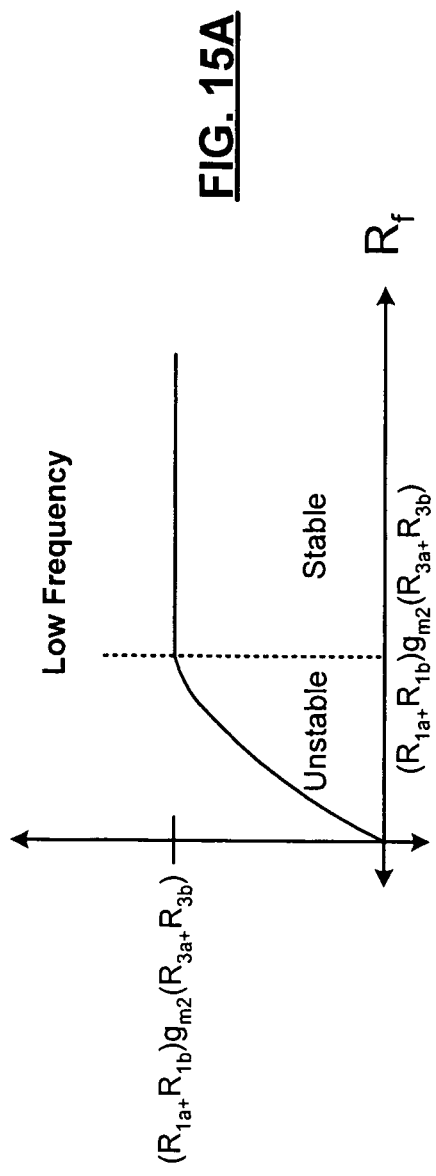
FIGS. 15A and 15B illustrate the gain of the TIA of FIG. 12 at low frequency and high frequency, respectively.
Figure 15B:
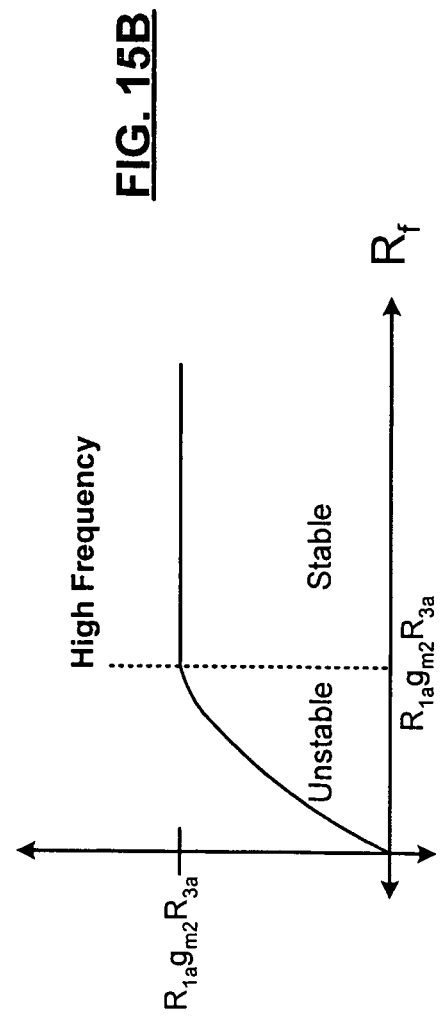

The TIA 150 further includes a feedback path 170 that communicates with the input and the output of the opamp 100. In FIG. 12A, the feedback path 170 has a resistance that decreases with increases in frequency. For example and referring now to FIG. 12B, the feedback path 170 includes a resistor $R_{3a}$ 172 connected in series with the parallel combination of a resistor $R_{3b}$ 173 and a capacitor and/or capacitance ($C_{P3}$) 174. While a combination of resistances and capacitances are shown, any other suitable techniques for providing a variable resistance may be used. For example, transistors can be used to short resistances and conventional approaches may be used. At low frequencies, the capacitor 174 is essentially an open circuit and the resistance of the feedback path 170 is essentially $R_3 = R_{3a} + R_{3b}$. At high frequencies, the capacitor 174 shunts the resistor 173 and the resistance of the feedback path 170 is essentially $R_{3a}$. The effect of this resistive transition is shown in FIGS. 15A and 15B. Likewise, the combination of resistances $R_{3a}$ and $R_{3b}$ and the capacitance $C_{P3}$ provide a variable resistance that decreases with increasing frequency.

Figure 13:
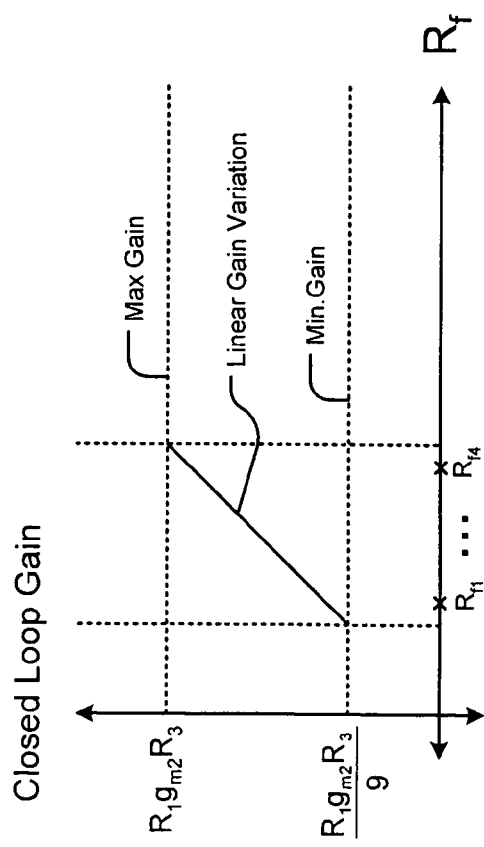
FIG. 13 is a graph of the gain of the TIA of FIG. 12 as a function of a resistance $R_f$.

Referring now to FIG. 13, the gain response for the TIA 150 is shown as a function of the resistance $R_f$. A maximum gain equal to $R_1 g_{m2} R_3$ can be produced at DC. A minimum gain equal to $R_1 g_{m2} R_3 / 9$ can be produced at frequencies greater than $3/C_{P1} R_1$ and $3/C_{P3} R_3$ when $R_{3a} = 2R_{3b}$ and $R_{1a} = 2R_{1b}$. Between these maximum and minimum gain levels, a linear gain variation region exists. Within the linear gain variation region, a desired above-unity gain level can be obtained by choosing an appropriate value of the resistance $R_f$.

Figure 14:
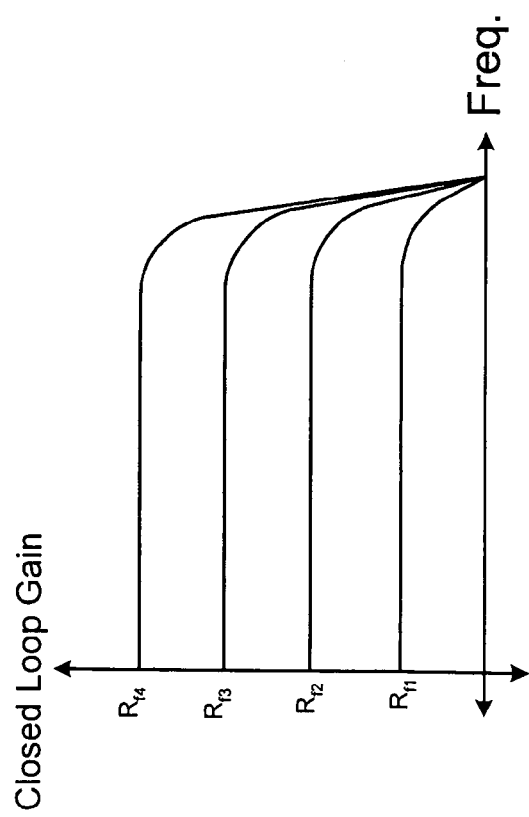
FIG. 14 is a graph of the closed loop gain of the TIA of FIG. 12.

Referring now to FIG. 14, the gain of the TIA 150 is shown for different values of resistance $R_{f1}$, $R_{f2}$, $R_{f3}$, and $R_{f4}$. Assuming $g_{m1}/C_1 \approx g_{m1}/C_2 \approx g_{m3}/C_3 \approx g_{m3}/C_4$, the non-dominant poles produced by capacitors $C_1$–$C_4$ are closely spaced. Therefore, each gain curve is relatively constant until reaching the closely spaced pole frequencies. At those higher frequencies, the gain falls off sharply. Thus, varying the gain of the TIA 150 (by varying the resistance $R_f$) produces only minimal variation in bandwidth.

Further, by choosing suitable transconductance and capacitance values, the poles of the TIA 150 are closely spaced at high frequencies. Therefore, the TIA 150 has a relatively constant bandwidth up to the non-dominant pole frequencies. At those frequencies, the gain drops off rapidly.

It should be understood that various values can be selected for the transconductance values $g_{m1}$, $g_{m2}$, and $g_{m3}$. For example, the same transconductance value can be used for all of the opamps 96, 98 and 100. Alternatively, each transconductance value can be different than one or more other transconductance values. For example, a larger value of $g_{m1}$ can be used for input noise or input impedance purposes. Further, a larger value of $g_{m3}$ can be used for output impedance purposes. However, it should be understood that other transconductance values can be used without departing from the scope of the invention.

Similarly, resistances $R_{1a}$, $R_{1b}$, $R_{3a}$, and $R_{3b}$, as well as capacitances $C_1$, $C_2$, $C_3$, $C_4$, $C_{P1}$ and $C_{P3}$, can be selected as desired for any given application of the invention. For example, resistors 158 and 172 can be twice as large as resistors 162 and 173, respectively, and the values of capacitors $C_{P1}$ and $C_{P3}$ can be the same. However, other resistance and capacitance values can be used without departing from the teachings of the present invention. For some preferred embodiments, the value of resistors 158, 162, 172, and 173 are the same. In some embodiments, the transistors in the op-amps are CMOS transistors.

Figure 16:
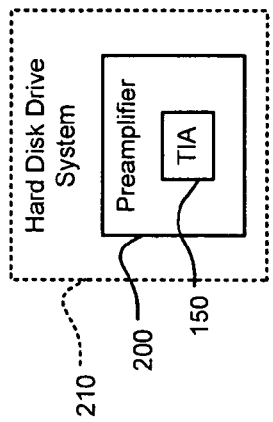
FIG. 16 illustrates the TIA of FIG. 12 in a preamplifier of a hard disk drive system.
Figure 17:
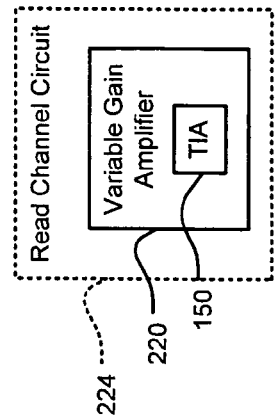
FIG. 17 illustrates the TIA of FIG. 12 in a variable gain amplifier of a read channel circuit.

Referring now to FIGS. 16 and 17, various exemplary applications are shown. In FIG. 16, the TIA 150 according to the present invention is employed by a preamplifier 200 of a hard disk drive system 210. In FIG. 17, the TIA 150 is implemented in a variable gain amplifier (VGA) 220 of a read channel circuit. Skilled artisans will appreciate that the TIA is suitable for other applications requiring a relatively constant bandwidth at various above-unity gain levels.

As can be appreciated, the TIA circuit according to the present invention provides constant bandwidth over a wide range of gain values. For example, one implementation provides a gain range of 5–50 or greater. Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A transimpedance amplifier (TIA) circuit, comprising:
   a first opamp having an input and an output;
   a second opamp having an input that communicates with an output of said first opamp and an output;
   a first feedback path that communicates with said input and said output of said first opamp and that includes a first resistance;
   a second feedback path that communicates with said input and said output of said second opamp and that includes a second resistance; and
   a third feedback path that communicates with said input of said first opamp and said output of said second opamp, wherein said first and second resistances are variable resistances that have resistance values that decrease as frequency increases.

2. A transimpedance amplifier (TIA) circuit, comprising:
a first opamp having an input and an output;
a second opamp having an input that communicates with an output of said first opamp and an output;
a first feedback path that communicates with said input and said output of said first opamp and that includes a first resistance;
a second feedback path that communicates with said input and said output of said second opamp and that includes a second resistance; and
a third feedback path that communicates with said input of said first opamp and said output of said second opamp,
wherein said first feedback path includes a first capacitance in parallel with said first resistance and wherein said second feedback path includes a second capacitance in parallel with said second resistance.

3. The TIA circuit of claim 2 wherein said first feedback path further includes a third resistance in series with said first resistance.

4. The TIA circuit of claim 3 wherein said third resistance has a resistance value that is approximately two times a resistance value of said first resistance.

5. The TIA circuit of claim 3 wherein said first and third resistances have substantially equal resistance values.

6. The TIA circuit of claim 2 wherein said second feedback path further includes a fourth resistance in series with said second resistance.

7. The TIA circuit of claim 6 wherein said fourth resistance has a resistance value that is approximately two times a resistance value of said second resistance.

8. The TIA circuit of claim 6 wherein said second and fourth resistances have substantially equal resistance values.

9. The TIA circuit of claim 6 wherein said first and second capacitances have substantially equal capacitance values.

10. A transimpedance amplifier (TIA) circuit, comprising:
a first opamp having an input and an output;
a second opamp having an input that communicates with an output of said first opamp and an output;
a first feedback path that communicates with said input and said output of said first opamp and that includes a first resistance;
a second feedback path that communicates with said input and said output of said second opamp and that includes a second resistance;
a third feedback path that communicates with said input of said first opamp and said output of said second opamp; and
a third opamp having an input that communicates with said output of said first opamp and an output that communicates with said input of said second opamp.

11. The TIA circuit of claim 1 wherein said third feedback path includes a fifth resistance.

12. The TIA circuit of claim 10 further comprising third, fourth and fifth capacitances that have one end that communicates with said inputs of said first, second and third opamps, respectively.

13. A transimpedance amplifier (TIA) circuit, comprising:
a first opamp having an input and an output;
a second opamp having an input that communicates with an output of said first opamp and an output;
a first feedback path that communicates with said input and said output of said first opamp and that includes a first resistance;
a second feedback path that communicates with said input and said output of said second opamp and that includes a second resistance;
a third feedback path that communicates with said input of said first opamp and said output of said second opamp; and
a sixth capacitance that communicates with said output of said second opamp.

14. A preamplifier comprising said TIA circuit of claim 1.

15. A hard disk drive comprising said preamplifier of claim 14.

16. A variable gain amplifier comprising said TIA circuit of claim 1.

17. A read channel circuit comprising said variable gain amplifier of claim 16.

18. A transimpedance amplifier (TIA) circuit, comprising:
first amplifying means for amplifying and having an input and an output;
second amplifying means for amplifying and having an input that communicates with said first amplifying means and an output;
first feedback means for providing feedback and that communicates with said input and said output of said first amplifying means and that includes first resistance means for providing a resistance;
second feedback means for providing feedback and that communicates with said input and said output of said second amplifying means and that includes a second resistance means; and
third feedback means for providing feedback and that communicates with said input of said first amplifying means and said output of said second amplifying means,
wherein said first and second resistance means provide variable resistances that decrease as frequency increases.

19. A transimpedance amplifier (TIA) circuit, comprising:
first amplifying means for amplifying and having an input and an output;
second amplifying means for amplifying and having an input that communicates with said first amplifying means and an output;
first feedback means for providing feedback and that communicates with said input and said output of said first amplifying means and that includes first resistance means for providing a resistance;
second feedback means for providing feedback and that communicates with said input and said output of said second amplifying means and that includes a second resistance means; and
third feedback means for providing feedback and that communicates with said input of said first amplifying means and said output of said second amplifying means,
wherein said first feedback means includes first capacitance means for providing capacitance in parallel with said first resistance means and wherein said second feedback means includes second capacitance means for providing capacitance in parallel with said second resistance means.

20. The TIA circuit of claim 19 wherein said first feedback means further includes third resistance means for providing resistance in series with said first resistance means.

21. The TIA circuit of claim 20 wherein said third resistance means has a resistance value that is approximately two times a resistance value of said first resistance means.

22. The TIA circuit of claim 20 wherein said first and third resistance means have substantially equal resistance values.

23. The TIA circuit of claim 19 wherein said second feedback means further includes fourth resistance means for providing a resistance in series with said second resistance means.

24. The TIA circuit of claim 23 wherein said fourth resistance means has a resistance value that is approximately two times a resistance value of said second resistance means.

25. The TIA circuit of claim 23 wherein said second and fourth resistance means have substantially equal resistance values.

26. The TIA circuit of claim 19 wherein said first and second capacitance means have substantially equal capacitance values.

27. A transimpedance amplifier (TIA) circuit, comprising:
first amplifying means for amplifying and having an input and an output;
second amplifying means for amplifying and having an input that communicates with said first amplifying means and an output;
first feedback means for providing feedback and that communicates with said input and said output of said first amplifying means and that includes a resistor;
second feedback means for providing feedback and that communicates with said input and said output of said second amplifying means and that includes a second resistance means;
third feedback means for providing feedback and that communicates with said input of said first amplifying means and said output of said second amplifying means; and
third amplifying means for amplifying and having an input that communicates with said output of said first amplifying means and an output that communicates with said input of said second amplifying means.

28. The TIA circuit of claim 18 wherein said third feedback means includes fifth resistance means for providing resistance.

29. The TIA circuit of claim 27 further comprising third, fourth and fifth capacitance means for providing capacitance and that have one end that communicates with said inputs of said first, second and third amplifying means, respectively.

30. A transimpedance amplifier (TIA) circuit, comprising:
first amplifying means for amplifying and having an input and an output;
second amplifying means for amplifying and having an input that communicates with said first amplifying means and an output;
first feedback means for providing feedback and that communicates with said input and said output of said first amplifying means and that includes first resistance means for providing a resistance;
second feedback means for providing feedback and that communicates with said input and said output of said second amplifying means and that includes a second resistance means;
third feedback means for providing feedback and that communicates with said input of said first amplifying means and said output of said second amplifying means; and
sixth capacitance means for providing capacitance and that communicates with said output of said second amplifying means.

31. A preamplifier comprising said TIA circuit of claim 18.

32. A hard disk drive comprising said preamplifier of claim 31.

33. A variable gain amplifier comprising said TIA circuit of claim 18.

34. A read channel circuit comprising said variable gain amplifier of claim 33.

35. A method for operating a transimpedance amplifier (TIA) circuit, comprising:
providing first and second amplifier stages, each having inputs and outputs;
feeding back an output of said first amplifier stage to said input of said first amplifier stage via a first resistance;
feeding back an output of said second amplifier stage to said input of said first amplifier stage via a second resistance;
feeding back said output of said second amplifier stage to said first amplifier stage; and
lowering a first resistance value of said first resistance at high frequencies relative to said first resistance value low frequencies.

36. A method for operating a transimpedance amplifier (TIA) circuit, comprising:
providing first and second amplifier stages, each having inputs and outputs;
feeding back an output of said first amplifier stage to said input of said first amplifier stage via a first resistance;
feeding back an output of said second amplifier stage to said input of said first amplifier stage via a second resistance;
feeding back said output of said second amplifier stage to said first amplifier stage; and
lowering a second resistance value of said second resistance at high frequencies relative to said second resistance value low frequencies.

37. A method for operating a transimpedance amplifier (TIA) circuit, comprising:
providing first and second amplifier stages, each having inputs and outputs;
feeding back an output of said first amplifier stage to said input of said first amplifier stage via a first resistance;
feeding back an output of said second amplifier stage to said input of said first amplifier stage via a second resistance;
feeding back said output of said second amplifier stage to said first amplifier stage; and
providing a third amplifier stage between said first and second amplifier stages.

38. A method for operating a transimpedance amplifier (TIA) circuit, comprising:
providing first and second amplifier stages, each having inputs and outputs;
feeding back an output of said first amplifier stage to said input of said first amplifier stage via a first resistance;
feeding back an output of said second amplifier stage to said input of said first amplifier stage via a second resistance;
feeding back said output of said second amplifier stage to said first amplifier stage; and
implementing said first resistance using a third resistance in parallel with a first capacitance and a fourth resistance in series with said third resistance.

39. A method for operating a transimpedance amplifier (TIA) circuit, comprising:
providing first and second amplifier stages, each having inputs and outputs;
feeding back an output of said first amplifier stage to said input of said first amplifier stage via a first resistance, feeding back an output of said second amplifier stage to said input of said first amplifier stage via a second resistance;

feeding back said output of said second amplifier stage to said first amplifier stage; and implementing said second resistance using a fifth resistance in parallel with a second capacitance and a sixth resistance in series with said fifth resistance.

40. The method of claim 38 further comprising setting said fourth resistance to a fourth resistance value that is approximately two times a third resistance value of said third resistance.

41. The method of claim 39 further comprising setting said sixth resistance to a sixth resistance value that is approximately two times a fifth resistance value of said fifth resistance.

42. The method of claim 38 further comprising setting said third and fourth resistances to substantially equal resistance values.

43. The method of claim 39 further comprising setting said fifth and sixth resistances to substantially equal resistance values.

* * * * *